United States Patent [19]
Liu

[11] Patent Number: 5,688,704
[45] Date of Patent: Nov. 18, 1997

[54] INTEGRATED CIRCUIT FABRICATION

[75] Inventor: Chun-Ting Liu, Berkeley Heights, N.J.

[73] Assignee: Lucent Technologies Inc., Murray Hill, N.J.

[21] Appl. No.: 565,286

[22] Filed: Nov. 30, 1995

[51] Int. Cl.$^6$ ........................................... H01L 21/8232
[52] U.S. Cl. .................. 437/41; 437/44; 437/203; 257/288
[58] Field of Search ..................... 257/283, 284, 257/288, 330; 437/40 GS, 40 SW, 40 SM, 41 GS, 41 SW, 41 SH, 44, 175, 176, 177, 203, 912; 156/653.1, 657.1

[56] References Cited

U.S. PATENT DOCUMENTS

| | | | |
|---|---|---|---|
| 5,171,698 | 12/1992 | Shimoda | 437/40 GS |
| 5,231,038 | 7/1993 | Yamaguchi et al. | 437/40 GS |
| 5,288,660 | 2/1994 | Hua et al. | 437/177 |
| 5,432,126 | 7/1995 | Oikawa | 437/177 |

FOREIGN PATENT DOCUMENTS

| | | | |
|---|---|---|---|
| 56-55074 | 5/1981 | Japan | 257/283 |
| 61-3457 | 1/1986 | Japan | 437/41 GS |
| 63-293885 | 11/1988 | Japan | 437/41 SH |
| 5-275457 | 10/1993 | Japan | 427/177 |

OTHER PUBLICATIONS

IBM Tech. Discl. Bulletin, 28(7)(1985)2767 "Self–Aligned Dummy Gate Sidewall–Spaced MESFET", Dec. 1985.

*Primary Examiner*—Charles L. Bowers, Jr.
*Assistant Examiner*—Leon Radomsky
*Attorney, Agent, or Firm*—John T. Rehberg

[57] ABSTRACT

A method of integrated circuit fabrication is disclosed. Layers of silicon nitride and silicide dioxide are formed upon a silicon substrate. These layers are etched to create a channel having the width of the intended gate. The silicon dioxide is then wet etched. Next, polysilicon is deposited within the channel. The silicon dioxide and the silicon nitride layers are then removed. A T-shaped polysilicon gate facilitates the formation of rectangular-shaped silicon nitride spacers. Subsequent salicidation is performed.

6 Claims, 3 Drawing Sheets

INTEGRATED CIRCUIT FABRICATION

TECHNICAL FIELD

This invention relates to integrated circuits and to methods for their manufacture.

BACKGROUND OF THE INVENTION

Many modern integrated circuits are formed by, first, defining field oxides with moats therebetween. The moats are covered by a thin layer of silicon dioxide, sometimes termed a "pad oxide". A blanket layer of polysilicon is then deposited over the entire wafer. The polysilicon is patterned to define the gate. (An optional ion implantation step may be performed at this point.) Frequently, a spacer is next formed by depositing a blanket layer of silicon dioxide from a precursor gas. The blanket layer of silicon dioxide is then anisotropically etched to form spacers adjacent to the gate. The spacers typically have curved or rounded sides. Next, the pad oxide is removed. (Another ion implantation may be performed at this stage.) If a silicide or "salicide" process is desired, a blanket layer of a refractory metal, such as titanium, may be next deposited. Then the structure is subjected to a heat treatment. The heat treatment causes a reaction between the refractory metal and underlying silicon, thereby forming a silicide. Thus, silicides are formed over the source and drain regions and over the gate. Unreacted metal which has been deposited for example, over the curved side of the spacer, and over the field oxide may then be chemically washed away.

The process described above possesses certain disadvantages. One disadvantage is that the etching process which is employed to define the gate, i.e. the process by which the blanket layer of polysilicon is etched, may also cause etching of the underlying pad or gate oxide. As integrated circuit dimensions shrink, gate oxide and pad oxide thicknesses also shrink. Consequently, it becomes increasingly difficult for the anisotropic etching process which is used to etch polysilicon to effectively stop upon very thin oxides. Consequently, there is an increasing danger that the pad oxide will be penetrated by the above-mentioned etching process. This penetration causes trenching of the silicon in the source or drain region and can lead to device failure.

Those concerned with the development of submicron silicide or salicide processes have also noticed an increase in so called "gate level defects" which contributes to leakage between the gate and source/drain regions, thereby causing transistor failures.

Consequently, those concerned with the development of integrated circuits have sought better methods as transistor fabrication.

SUMMARY OF THE INVENTION

Illustratively, these concerns are addressed by the present invention which includes:

forming first and second material layers overlying a substrate;

forming a channel through the first and second layers;

isotropically etching the second layer, thereby creating two cavities adjacent the channel;

depositing a conductive material in the channel and the cavities, thereby forming a structure having a generally "T" shape, having two arms and a central portion;

removing the second layer;

anisotropically etching the first layer, thereby forming rectangular spacers comprised of the first material; and removing the two arms of the "T"-shaped structure, at least some of the central portion of the structure remaining, thereby exposing the rectangular spacers.

DETAILED DESCRIPTION

An investigation of gate level defects, produced a variety of hypotheses about their causes. One hypothesis is that the polysilicon gate material, after being subjected to a variety of thermal processing, recrystallizes. The recrystallized grains protrude through the gate oxide, thereby causing transistor failures. An alternative hypothesis is that the subsequently-formed silicide or salicide penetrates the curved wall of the oxide spacer, thereby causing device failures. Finally, another hypothesis is that the lower corner of the curved oxide spacer has a structural weakness which permits metal to diffuse through to the substrate, thereby causing transistor failure.

Figure 1:
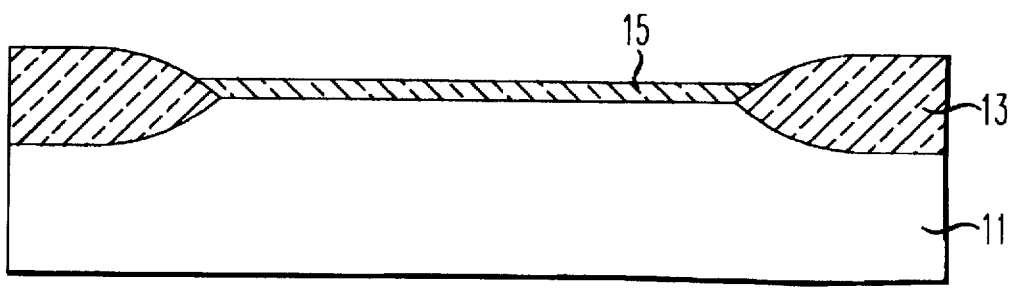
FIGS. 1-10 are cross sectional views useful in understanding an illustrative embodiment of the present invention.
Figure 2:
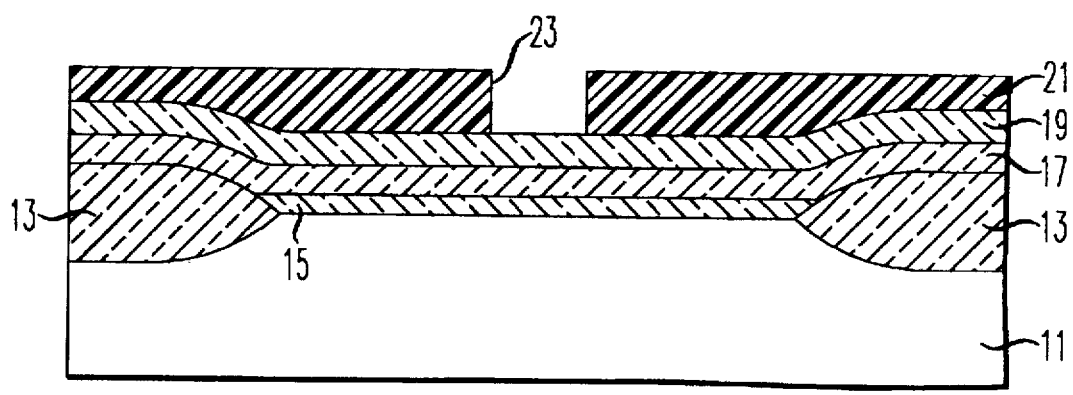

The inventive process, however, addresses the above-mentioned concerns. In FIG. 1, reference numeral 11 denotes a substrate which may, typically, be silicon, doped silicon, epitaxial silicon, etc. In general, the term substrate refers to a material upon which other materials may be formed. Reference numeral 13 denotes the field oxide which may, illustratively, but not necessarily be formed by well known processes such as the LOCOS process. Reference numeral 15 denotes a silicon dioxide layer. Typically the thickness of silicon dioxide layer 15 is between 10 nm and 20 nm. In FIG. 2 blanket layer 17 is a layer of silicon nitride, illustratively formed by a well known processes, and having a thickness of between 100 nm and 300 nm. Layer 19 is a layer of silicon dioxide, typically formed from a precursor such as silane, TEOS, PETEOS (plasma-enhanced TEOS), or other well known precursors. Illustratively, the thickness of layer 19 is between 100 nm and 300 nm. Photoresist 21 denotes a patterned photoresist. Reference numeral 21 has been patterned to create opening or channel 23. The length of opening 23 is typically, the length of the desired gate, illustratively 0.5 μm or less.

Figure 3:
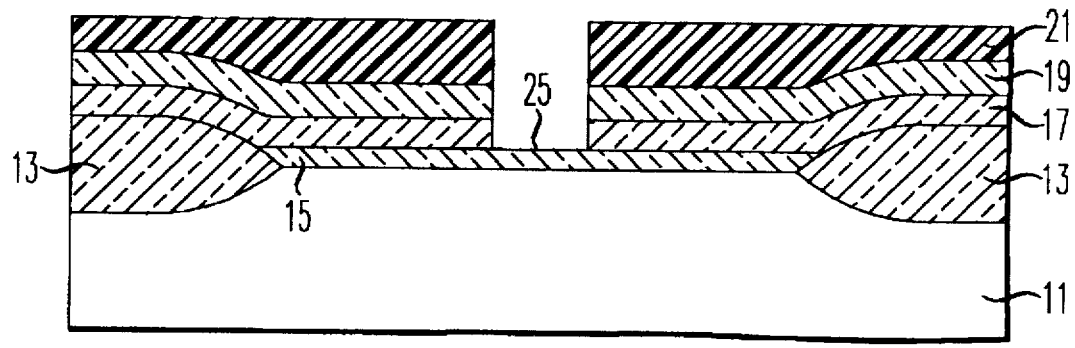

In FIG. 3, layers 19 and 17 are patterned with dry etching processes known to those skilled of the art, using patterned photoresist 21 as a mask.

Figure 4:
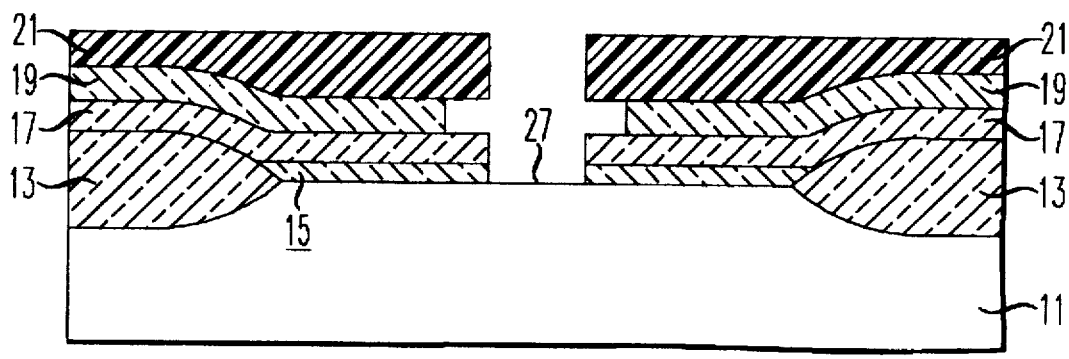

Turning to FIG. 4, a wet etch, typically utilizing HF is performed. The etching step removes portion 25 of layer 15 which was exposed by the previous etching step. Thus, surface 27 of substrate 11 is exposed. Furthermore, the HF etch step also laterally removes a portion of silicon dioxide 19. Typically, a lateral removal of between 500 Å and 1500 Å may be expected.

Figure 5:
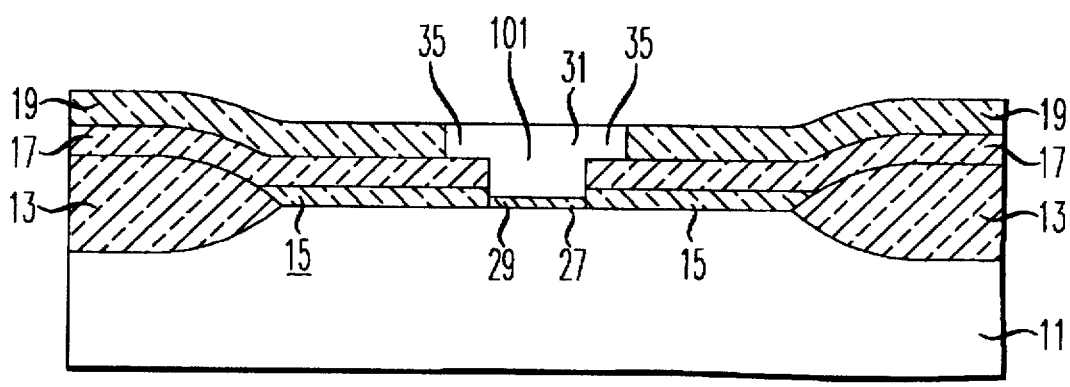

Next, photoresist 21 is removed. Then, a gate oxide is grown upon surface 27. The gate oxide may be made extremely thin without the fear that any subsequent etching steps will cause damage to silicon substrate 11. For example, the gate oxide having a thickness of between 80 and 90 Å or as thin as 25 Å may be formed. The newly-formed gate oxide is denoted by reference numeral 29 in FIG. 5. Then a blanket layer of polysilicon is deposited and etched back. After the etch back process is performed, a "T" shaped polysilicon structure denoted by reference numeral 31 is formed and illustrated in FIG. 5. The "T" shaped structure 31 has two arms 35 and a central portion 101.

Figure 6:
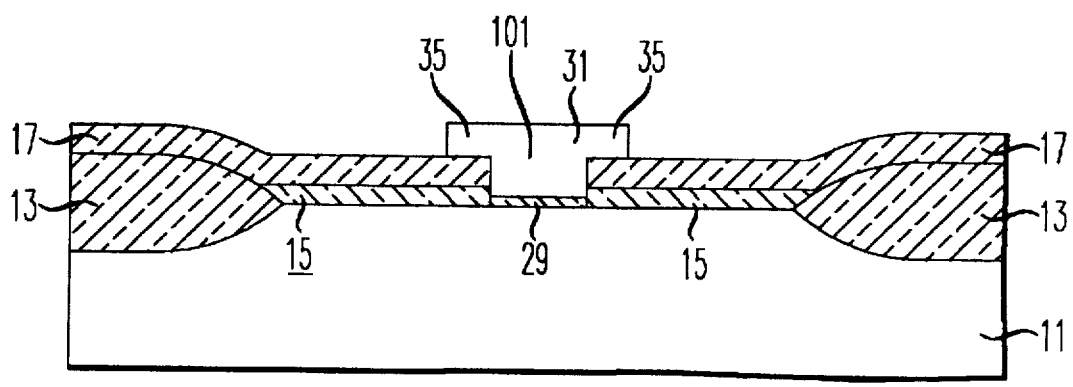

Turning to FIG. 6, silicon dioxide layer 19 is removed utilizing other dry etch or wet etch procedures.

Figure 7:
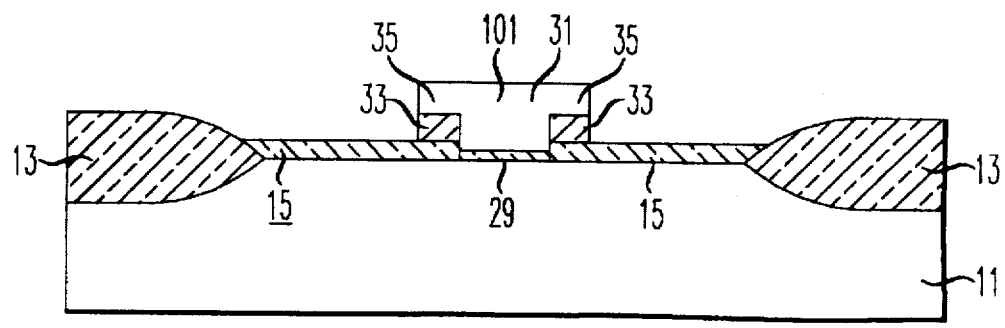

Turning to FIG. 7, an anisotropic etch procedure is performed to remove most of silicon nitride layer 17. It will be noted, however, that a rectangular portion 33 of original layer 17 remains beneath the upper extending arms 35 of T-shaped polysilicon gate 31.

Figure 8:
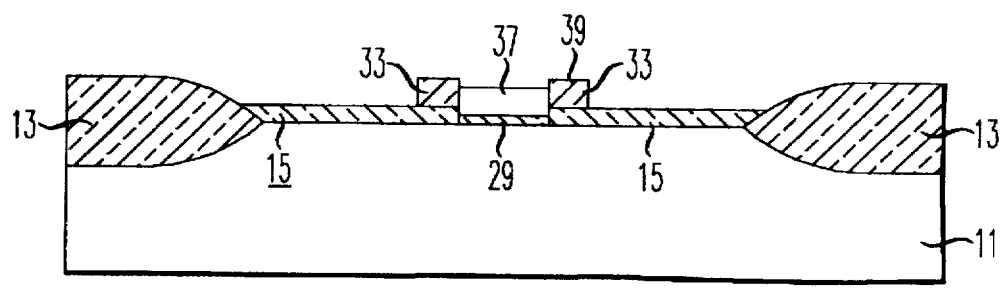

In FIG. 8, polysilicon gate 31 has been dry or wet etched so that the upper surface 37 of polysilicon gate is lower than the upper surface 39 of rectangular shaped silicon nitride spacers 33. Thus, some of the central portion 101 of gate 31 has been removed.

Figure 9:
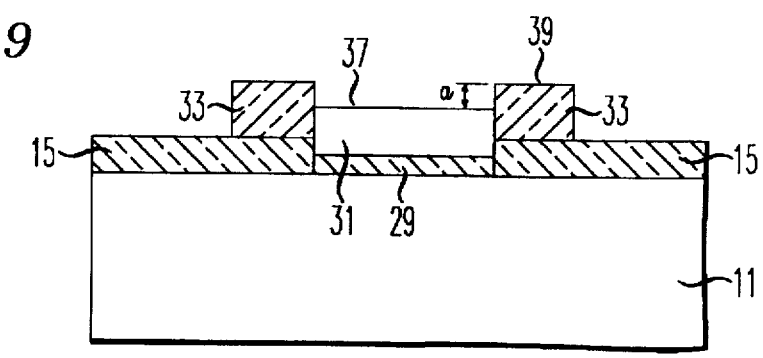
Figure 10:
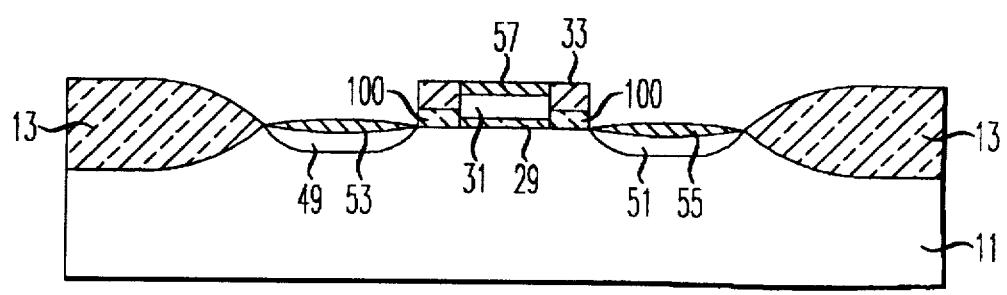

As illustrated in FIG. 9, the height difference, denoted by "a" is determined by the thickness of silicon dioxide layer 19 and silicon nitride layer 17 and also by the etching selectivity between polysilicon and silicon nitride.

Next, source and drain region ion implantations are performed to create source and drain regions 49 and 51. A wet etch is performed to remove oxide layer 15, but underlying rectangular oxide portions 100 are not removed. Then a refractory metal, such as titanium is blanket depositied. After a heat treatment, silicides 53 and 55 are formed over source and drain regions 49 and 51 respectfully. Furthermore, silicide 57 is formed over polysilicon gate 31. The rectangular spacer 33 helps to prevent degradation or bridging of the silicide and eliminate the possibility of other failure mechanisms previously discussed.

The invention claimed is:

1. A method of semiconductor integrated circuit fabrication comprising:

forming first and second material layers overlying a substrate;

forming a channel through said first and second layers;

isotropically etching said second layer, thereby creating two cavities adjacent said channel;

depositing a conductive material in said channel and said cavities; thereby forming a structure having a generally "T" shape; having two arms and a central portion;

removing said second layer;

anisotropically etching said first layer; thereby forming rectangular spacers comprised of said first material; and removing said two arms of said "T" shaped structure, at least some of said central portion of said structure remaining, thereby exposing said rectangular spacers.

2. The method of claim 1 further including the steps of:

blanket depositing a refractory metal upon said central portion of said structure and said substrate;

reacting said refractory metal with said central portion of said structure to form a silicide.

3. The method of claim 2 in which a first dielectric is formed between said first material and said substrate.

4. The method of claim 3 in which a portion of said first dielectric is exposed by said channel forming step and further including the step of removing said exposed portion of said first dielectric, thereby exposing said substrate.

5. The method of claim 4 further including the step of growing a gate oxide upon said exposed portion of said substrate.

6. The method of claim 5 further including the step of exposing said substrate to a dopant species after removal of said two arms of said "T" structure thereby forming source and drain regions.

* * * * *